United States Patent
Yui et al.

[11] Patent Number: 6,011,912
[45] Date of Patent: Jan. 4, 2000

[54] AUTOMATIC ROUTING METHOD WITH NET ORDERING FOR FACILITATED COLLISION EVASION

[75] Inventors: Nobuyasu Yui; Hiroyoshi Yamazaki, both of Tokyo, Japan

[73] Assignee: NEC Corporation, Tokyo, Japan

[21] Appl. No.: 08/909,883

[22] Filed: Aug. 12, 1997

[30] Foreign Application Priority Data

Aug. 15, 1996 [JP] Japan .................................. 8-215640

[51] Int. Cl.[7] .................................................. G06F 17/50
[52] U.S. Cl. ........................ 395/500.14; 395/500.02
[58] Field of Search .................................. 364/489, 490, 364/491; 395/500.13, 500.14, 500.15

[56] References Cited

U.S. PATENT DOCUMENTS

| | | | |
|---|---|---|---|
| 5,309,371 | 5/1994 | Shikata et al. | 364/491 |
| 5,355,322 | 10/1994 | Yamashita et al. | 364/490 |
| 5,673,201 | 9/1997 | Malm et al. | 364/491 |
| 5,729,467 | 3/1998 | Katsumata et al. | 364/389 |
| 5,729,469 | 3/1998 | Kawakami | 364/490 |
| 5,790,414 | 8/1998 | Okano et al. | 364/488 |

FOREIGN PATENT DOCUMENTS 5-101147  4/1993  Japan .

OTHER PUBLICATIONS

Dutta et al.: "Multilayer Area Routing Algorithm as Optimization Problem," IEEE Custom Integrated Circuits Conference May 1990, p. 27.4.1–27.4.4.

Malavasi and Sangiovanni–Vincentelli: "Area Routing for Analog Layout," IEEE Transactions of Integrated Circuits and Systems, vol. 12 No. 8, Aug. 1993, p. 1186–1197.

Lai and Eades "Routing Drawings in Diagram Displays," Proceedings of the 3rd Asia Pacific Computer Human Interaction Conference, Jul. 15–17, 1998, p. 291–296, Jun. 1998.

H. Shin et al., "A Detailed Router Based on Incremental Routing Modifications: Mighty", IEEE Transactions on Computer–Aided Design, vol. CAD–6, No. 6, Nov. 1987, pp. 942–955.

Primary Examiner—Kevin J. Teska
Assistant Examiner—Marcel Pruessner
Attorney, Agent, or Firm—Foley & Lardner

[57] ABSTRACT

In an automatic routing method for layout design, the present invention reduces wasteful detours or bends of the routing paths, so that it also reduces non-completed paths, that cannot be completed without rip-up and rerouting. All nets are provisionally routed in such a manner as to allow more facilitated evasion of collision such as shorting between nets (step 15). The net order is then set (step 16). If collision between nets is found, the processing order is changed so that a net which is judged to allow for more facilitated evasion of collision will be finalized later. The routing paths are then finalized net by net (steps 17 to 20). The shape of the colliding path, for example, is used as a criterion for judging ease in evasion.

11 Claims, 14 Drawing Sheets

AUTOMATIC ROUTING METHOD WITH NET ORDERING FOR FACILITATED COLLISION EVASION

BACKGROUND

FIELD OF THE INVENTION

The present invention relates to a layout designing method and system.

DEFINITIONS

Figure 12:
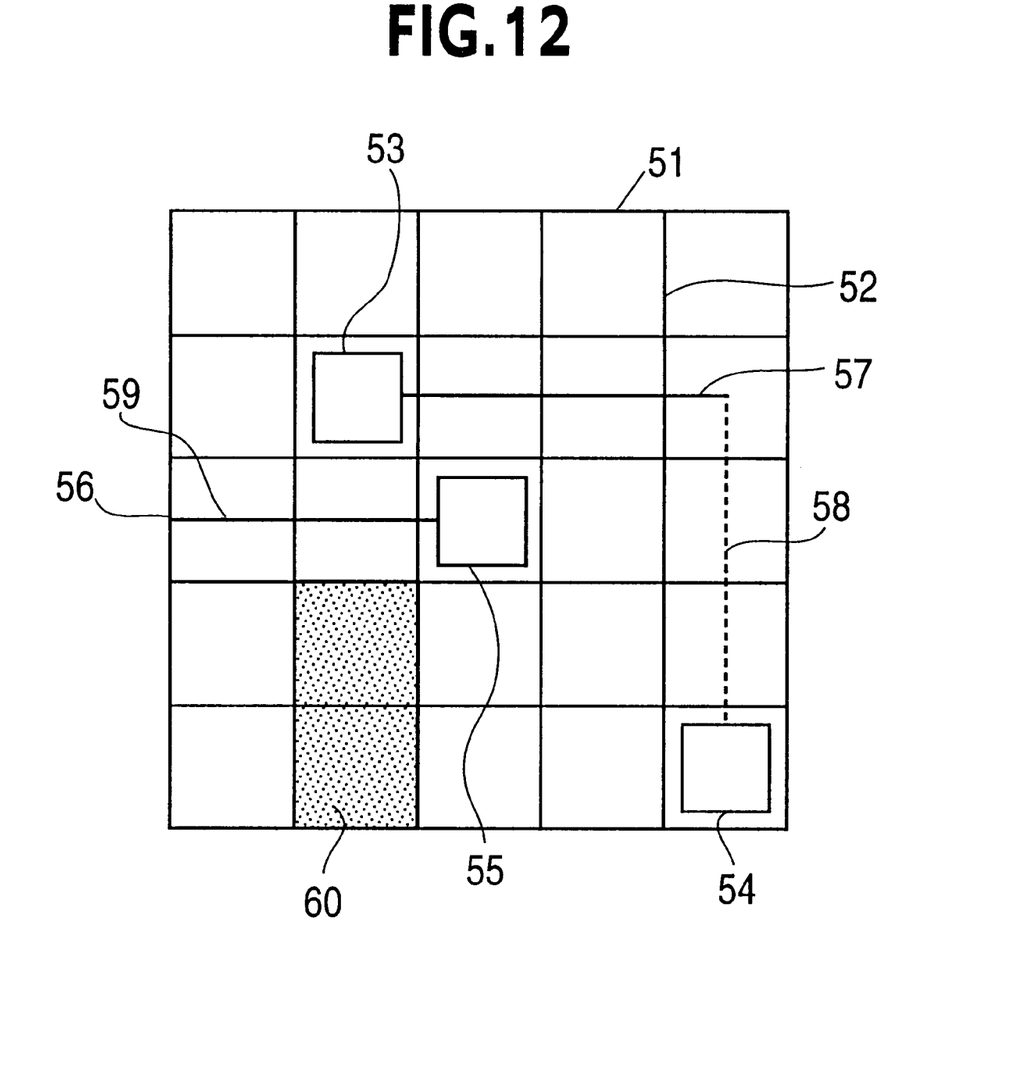
FIG. 12 illustrates layout showing a model of a routing problem.

Referring to the drawings, basic terms will be explained. FIG. 12 shows a routing model of the present invention. A routing area 51 is divided by fine broken lines 52 into plural rectangular sub-areas. These rectangular sub-areas are termed grid points. An array of the grid points in the vertical or horizontal direction is termed a routing track. In the drawing, square profiles 53, 54, 55 denote terminals, while the boundary 56 of the area 51 is a sort of a terminal connecting to outside of the area, and is termed a pseudo terminal.

A set of terminals to be interconnected is termed a net, the routing route or path of which is represented by an array of the grid points. For example, the routing of a net constituted by the terminals 53 and 54 is 57 and 58, while the routing of a net made up of a terminals 55 and the pseudo terminal 56 is 59. On the other hand, line segments, such as 57,58,59 are termed routing segments, while grid points 60 shown by fine half-tone dots are obstruction areas.

The present model permits plural routing layers. In the drawing, the first-layer routings 57 and 59, and the second-layer routing 58 are denoted by thick solid lines and by a thick dotted line, respectively. The grid points interconnecting the routings on the different layers are provided with interconnecting through-holes (vias), although not shown.

RELATED ART

Figure 13:
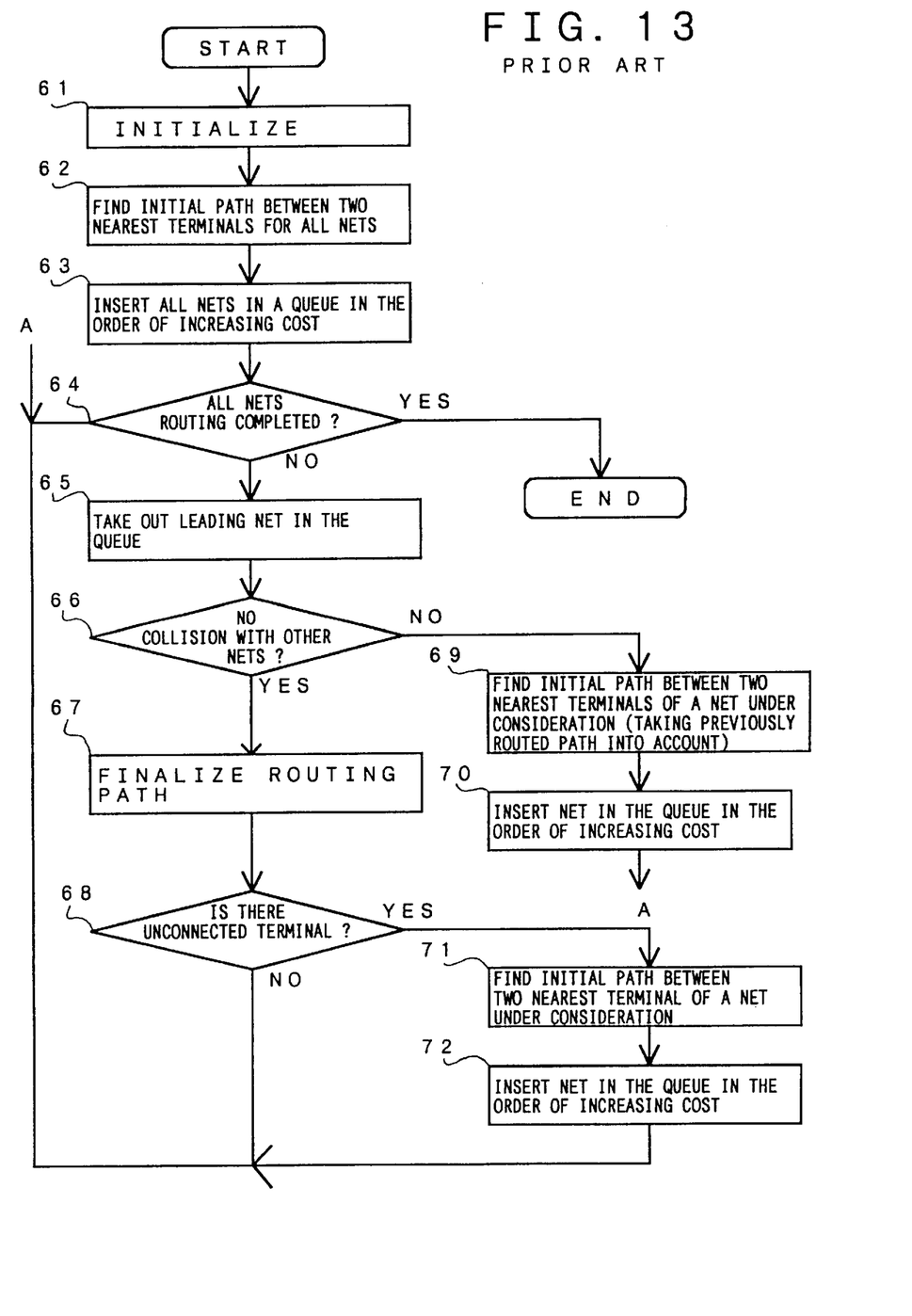
FIG. 13 is a flowchart for illustrating automatic routing processing in a conventional system.

Now conventional technique will be explained. FIG. 13 shows a flowchart for illustrating a conventional technique. Roughly, an initial routing step and a finalizing step are executed.

At first, at an initializing step 61, routing paths or routes between two closest terminals are found net by net for all nets. Even if there are plural terminals, only a routing path for the closest two terminals is found (step 62). Since the paths of the nets other than the net under routing is not deemed to be an obstacle, while a shorting or spacing violation with these is disregarded, the routing path thus found is termed an initial path (pseudo path). The state of violation between the paths of the nets is herein termed a collision. The provisional path is occasionally modified at the finalizing step.

If the provisional paths have been found for all nets, costs are assigned for the nets in accordance with the shape of the paths, and the nets are inserted in a queue in the order of increasing cost (step S63). Usually, a net with a shorter routing length and with a smaller number of vias is inserted in a more forward position in the queue.

From this queue, the nets are taken out one by one in order to execute the finalizing step. At first, the queue is checked and, if it is empty, the routing has been completed, so that the step comes to END (step 64). If the routing has not been completed, a net at the leading end of the queue is taken out (step 65) and, if the initial path of the net does not collide against other previously finalized path(s), the path is ultimately determined, is finalized (steps 66, 67).

If the path is finalized at step 67, there is an occasion where there are non-connected terminal(s) in a net having three or more terminals (multi-terminal net). If there are such non-connected terminals, the finalized path is regarded as a sole large terminal, and an initial path between the two closest terminals is found (step 71). This initial path is entered into the queue at step 62 (step 72), after which processing returns to step 64.

If, at step 66, the path collides against other previously finalized path(s), an initial path between two closest terminals is found, without allowing for a collision with other previously finalized paths this time (step 69), in order to enter the initial path thus found in the queue (step 70). The step then returns to step 64.

If, at step 69, a routing path which does not allow collision is not found at step 69, routing cannot be done unless the net is ripped-up in order to perform re-routing or manual modification. The conventional technique which realizes this is described in, for example, "A Detailed Router Based on Incremental Routing Modifications: Mighty" in "IEEE TRANSACTIONS ON COMPUTER-AIDED DESIGN, VOL. CAD-6, NO.6, NOVEMBER 1987". Although a technique of determining the routing order for the net routing which considers the routing length as a constraint is disclosed in, for example, JP Patent Kokai JP-A-Hei 5-101147, this does not realize an improved routability.

SUMMARY OF THE INVENTION

There is much to be desired in the aforementioned conventional art.

The first problem is that, if the net path is defined beginning from a net having a shorter length of the initial routing or a smaller number of vias, detours or bends occasionally are produced. The reason is explained with reference to FIG. 14, in which the number of routing layers is two and an area shown by fine half-tone dots 73 is an obstruction area of the first layer.

Figure 14A:
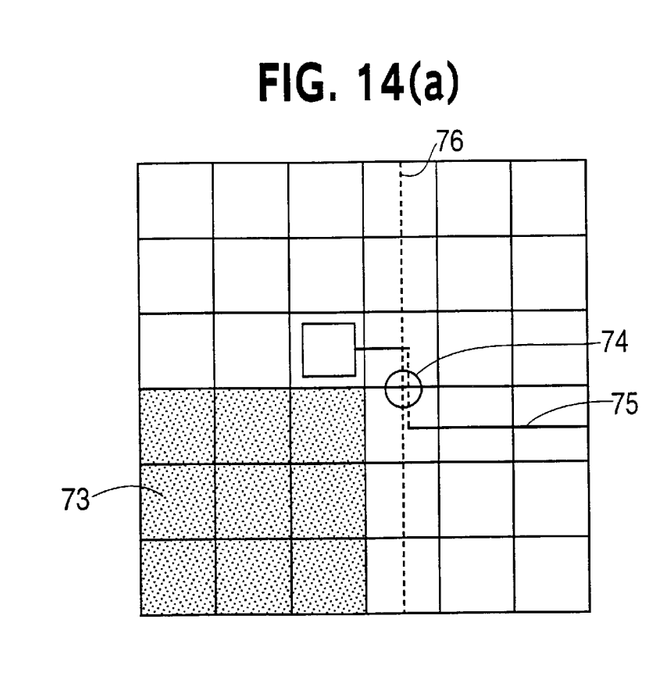
FIG. 14 shows a layout for illustrating a problem in the conventional system.
Figure 14B:
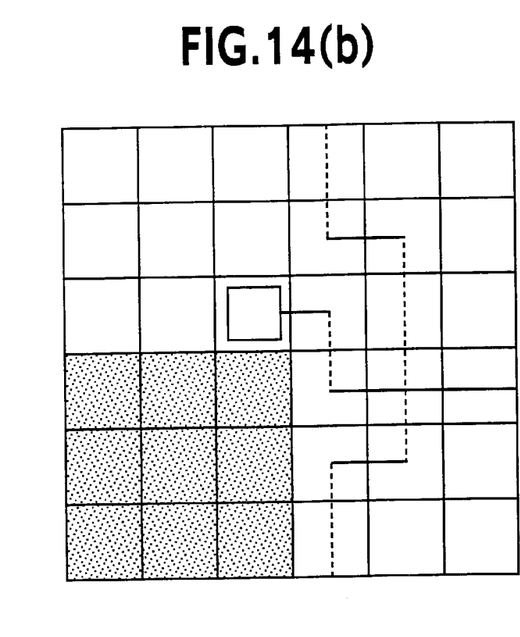

In the conventional method, the nets to be routed are handled only individually, so that, if a net undergoes collision at 74 as shown in FIG. 14(a), difficulties are raised in connection with the net setting sequence. In the following, it is assumed that a cost value used in a conventional technique is a provisional routing length for the distance between the grid points (or between a grid point and an imaginary terminal) set to unity (1). In the present example, the costs for the nets 75 and 76 are calculated to be 5 and 7, respectively, so that the net 75 is lower in cost. Therefore, the net 76 is finalized after finalizing the net 75. Since the routing needs to evade 75 at a time point of finalizing 76, there results an increased routing length by detours or bends as shown in FIG. 14(b). However, in the present example, routing could be done without detours if 76 would be finalized previously.

The second problem is that, as a result of the above-mentioned first problem, uncompleted routing (routing which cannot be completed unless such technique as rip-up and re-routing is used) tends to be produced. The reason is explained with reference to FIG. 15. It is again assumed that there are two routing layers, and that areas shown with fine half-tone dots 77, 78 represent obstruction areas of the first layer.

Figure 15A:
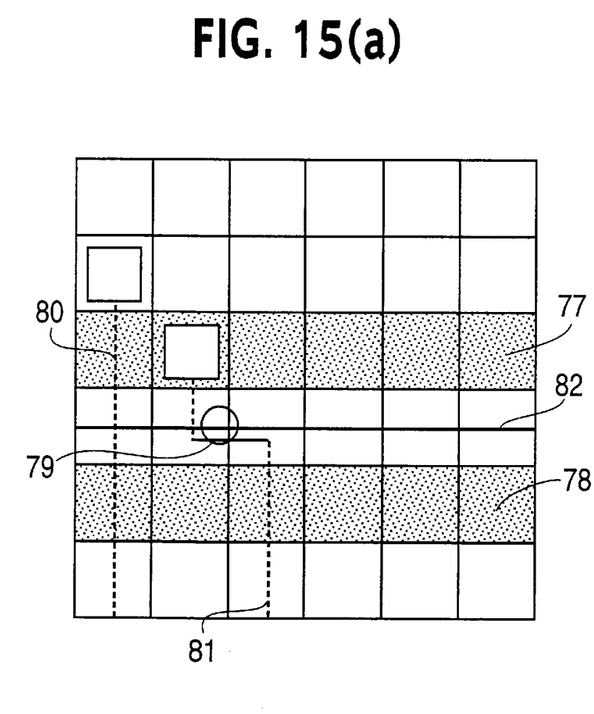
FIG. 15 shows a layout for illustrating another problem in the conventional system.
Figure 15B:
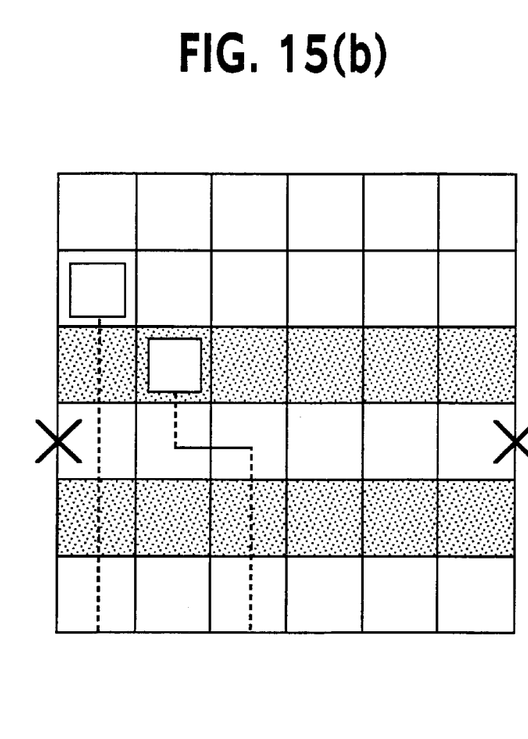

It is assumed that, if cost setting is done by a conventional method for an initial routing in which has occurred a collision 79 in FIG. 15(a), the costs for nets 80, 81 and 82 are 5, 5, 7, respectively, such that the path finalizing order is 80, 81, 82. With this order, the first and second layers are already stopped up (occupied) with other paths when it is desired to finalize 82, as shown in FIG. 15(*b*). Therefore, this path cannot be laid and hence proves to be an uncompleted routing, no matter in which manner other paths are evaded.

Moreover, if an uncompleted routing is produced, it becomes necessary to rip-up existing paths to make re-routing or to correct the routing by manual operation, such that the target density cannot be achieved based on automatic layout alone or processing time is increased due to manual correction.

Therefore, it is an object of the present invention to provide a novel automatic routing method or system freed from the above drawbacks in the conventional art. Other objects will become apparent in the entire disclosure.

The present invention is characterized in that not only the net finalizing order is set based on the routing length and the number of vias of an initial routing but also the net order is set so that, if a net collision occurred, the net which will allow for more facilitated collision evasion will be finalized later.

The present invention provides an automatic routing method of layout design for an LSI and a printed board. The method comprises the following steps: entering data of the layout design information by a data input device ; storing the layout design information in a memory device; and provisionally routing all nets with reference to the layout design information. The method further comprises setting an order for the finalized routing of the nets so that, in case of an occurrence of a net overlapping in the provisional routing, those nets that allow for more facilitated evasion will be finalized later; and performing finalized routing of the nets in accordance with the set order.

According to an aspect of the present invention, the layout design information is comprised of the information of design rule, net list, terminals, obstructions, pre routes and initial routes. The automatic routing operation is carried out by reading the information of design rule, net list, terminals, obstructions and pre-routes from a disc into a memory device, and also storing the initial routing in the memory device.

According to another aspect of the present invention, all nets are provisionally routed with reference being made to the information of design rule, net list, terminals, obstruction and the pre-routes, and subsequently the net processing order is set. The routing of the nets is initially ordered to begin from the net of a shortest routing length, if there is no net collision. On the other hand, if a collision point is found, the colliding nets are compared to one another. If a net judged to allow for more facilitated collision evasion is set to be routed earlier, the relative position of the net is interchanged with a net at a leading end of a queue so that the former net will be routed later. If new initial routing is done in a multi-terminal net, this net is inserted in a suitable position in a queue by applying the net ordering means. In case of collision with other previously routed path(s), an initial path between two nearest terminals is found without allowing for collision with previously finalized path this time to enter the net in the queue.

According to a further aspect of the present invention, the shape of both ends of the routing segment subjected to overlapping is used as a criterion for judgment for evading net overlapping. According to a still further aspect of the present invention, the length of the routing segment subjected to overlapping is used as a criterion for judgment for evading net overlapping.

According to a still further aspect of the present invention, the routing length from a terminal to a routing segment subjected to overlapping is used as a criterion for judgment for evading net overlapping.

According to a further aspect of the present invention, the width of translational movement of the routing segment subjected to overlapping for evading the net overlapping is used as a criterion for judgment for evading net overlapping.

According to a further aspect of the present invention, any optional combination of the shape of both ends of the routing segment subjected to overlapping, length of the routing segment subjected to overlapping, the routing length from the terminal to the routing segment subjected to overlapping and the width of translational movement of the routing segment subjected to overlapping for evading the net overlapping is used as a criterion for judgment for evading net overlapping.

Following meritorial effects are achieved by the present invention.

With the layout method of the present invention, as described above, the order of finalizing the paths is set in consideration of the colliding state of nets for preventing the routing length by wasteful detours or bends from being increased.

Since this raises the degree of freedom of the routing tracks that can be used by subsequently finalized tracks, the uncompleted nets can be decreased while the routing efficiency by automatic routing can be improved.

From the above, the high integration of automatic routing and reduction in TAT can be realized.

PREFERRED EMBODIMENTS OF THE INVENTION

Figure 1:
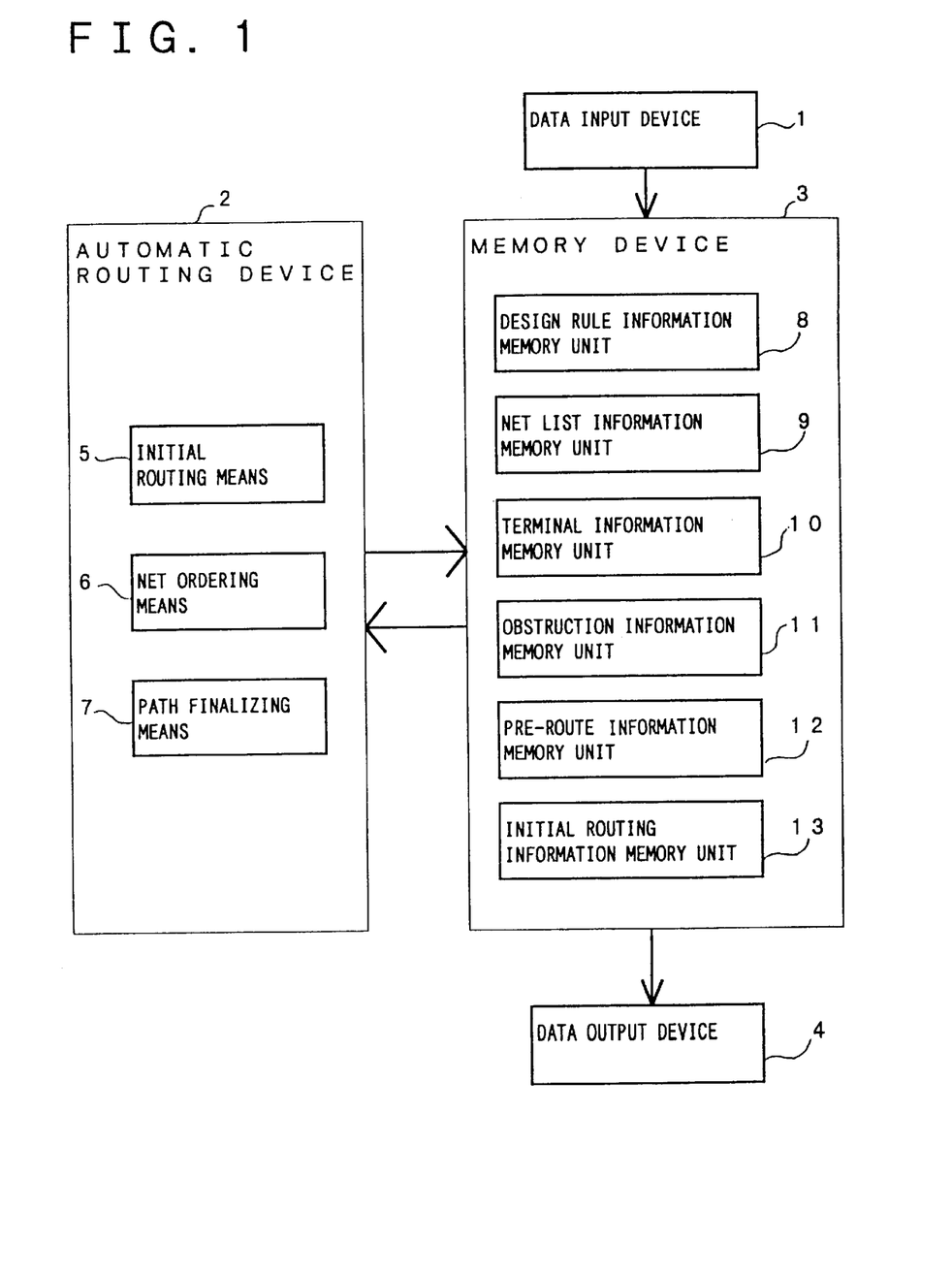
FIG. 1 is a block diagram showing an embodiment of the present invention.

Referring to the drawings, a preferred embodiment of the present invention will be explained. FIG. 1 shows a block diagram showing an embodiment of the present invention.

The present embodiment is constituted by a data input device 1, an automatic routing device 2, a memory device 3 and a data output device 4. The automatic routing device 2 includes initial routing means 5, net ordering means 6 and path finalizing means 7. The memory device 3 includes a design rule information memory unit 8, a net list information memory unit 9, a terminal information memory unit 10, an obstruction information memory unit 11, a pre-routes information memory unit 12, and an initial routing information memory unit 13 as a transient memory device.

Figure 2:
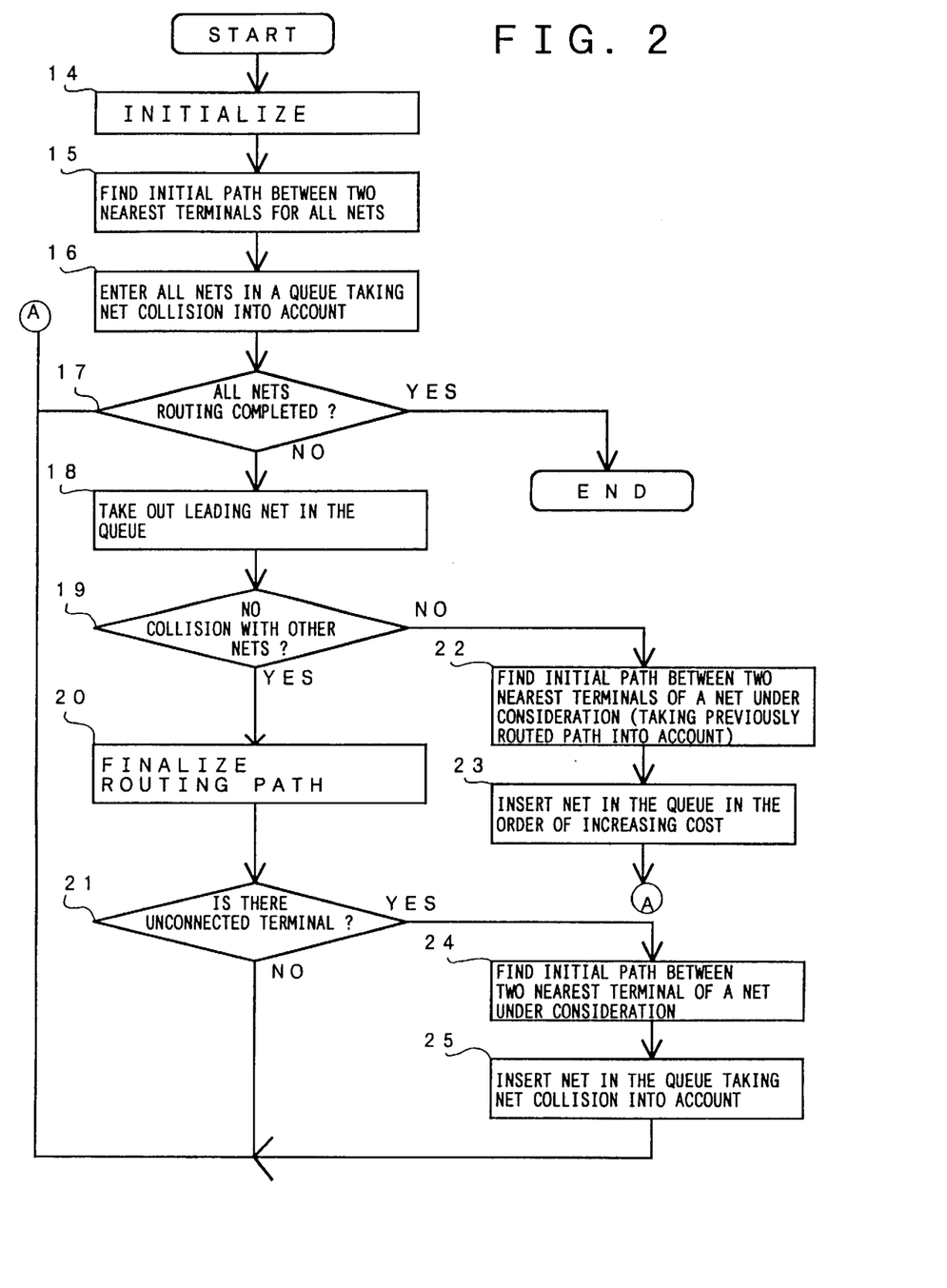
FIG. 2 is a flowchart for illustrating the automatic routing steps according to the embodiment of the present invention.

Referring to FIGS. 1 and 2, operation of the present embodiment is explained. The entire nets are provisionally routed by the initial routing means 5, with reference made to the design rule information, net list information, terminal information, obstruction information and pre-routes information (step 15). Since the initial routing of any other net is not deemed to be an obstacle, there are occasions where the initial routing suffers from violations, such as a short.

Then, using the net ordering means 6, the net processing sequence is set and the entire nets are entered into a queue (step 16). At first, the queue is checked. If the queue is found to be empty, routing of all nets has come to a close, so the processing is terminated (YES at step 17). If not, a net at the leading end of the queue is taken out (step 18) and the path setting processing is performed by path finalizing means 7. If there is no collision in the nets, the paths are finalized by the path finalizing means 7, as is conventionally done, beginning from the net with a shortest routing length (steps 17, 18, 19, 20). If a collision point is found at step 19, the colliding nets are compared. If a net judged to avoid collision more easily (termed "easier net") is set for being routed earlier, the relative positions of the nets in the queue are interchanged so as to route the easier net later.

Figure 3A:
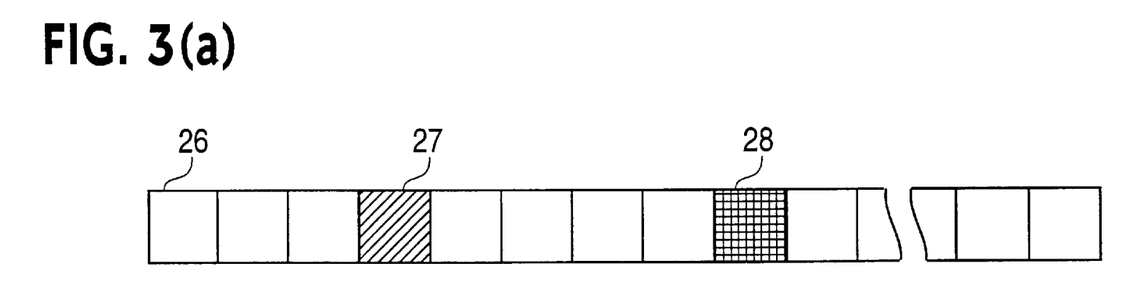
FIG. 3 illustrates a queue according to the embodiment of the present invention.
Figure 3B:
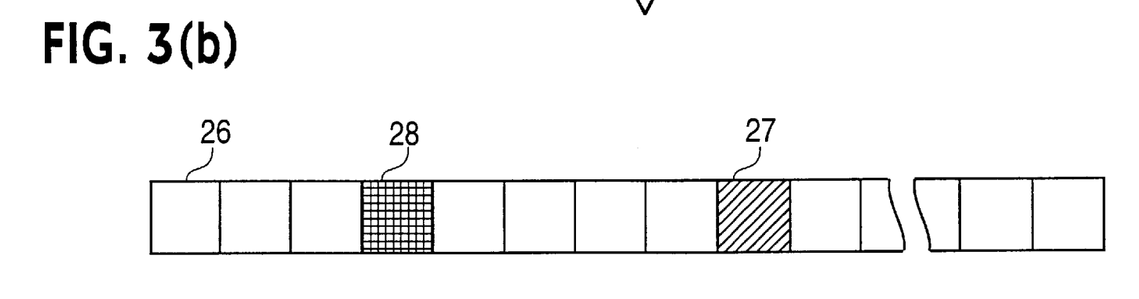

The queue for interchanging the relative positions is shown. It is assumed that, in FIG. 3(*a*) showing a queue, a set of colliding nets 27, 28 has been found. At present, the net 27 is arrayed towards the leading end 26 of the queue, with the net 28 being arrayed towards the rear side of the net 27. If the net 27 has been found to evade collision more easily, the nets 27, 28 are interchanged so as to locate the net 28 first and the net 27 later, resulting in reversing the processing order, as shown in FIG. 3(*b*).

In effect, there are occasions wherein three or more nets collide with one another. For interchanging the sequence in this case, it suffices to use an algorithm typified by topological sorting. However, if new provisional routing is done for a multi-terminal net, this net is inserted into a proper point in the queue by applying the net ordering means 6 (steps 24 and 25).

If, at step 19, a net collides with another previously finalized path, an initial path between two nearest terminals is found without allowing for collision with the previously finalized path this time (step 22) and the net is entered into the queue (step 23) before processing returns to step 17. Since the path is laid in accordance with the design rule this time, there occurs no collision with other paths. The step then returns to step 17.

In the present invention, the following criteria are used for judging relative ease in evading collision. The first criterion is the shape of both ends of a routing segment which has undergone collision. The second is the length of the routing segment which has undergone collision. The third is the routing length from the terminal to the routing segment which has undergone collision. The fourth is the width by which the collided routing segment is moved in translational movement for evading the collision. The fifth is any combination of the first to fourth criteria.

In the following Examples, these first to fifth judgment criteria are explained in detail. It should be noted that the present invention cannot find a complete solution in distinction from a channel router. According to the channel router, the terminals of these nets are routed together for a given routing area and for a given set of nets without overlapping with the aid of, for example, the technique of the Graph theory etc. This method cannot be applied to the routing task of the present invention because of stringent constraint on the models being handled.

EXAMPLES

An example in which the sequence is judged from the shape of both ends of routing segment which has undergone collision (referred to herein as Example 1) is explained.

At first, a segment which has undergone collision is found and respective routing patterns are checked. The shape of the routing segments and the order of priority may be summarized as shown below. FIG. 4 shows examples of routing patterns, where a segment marked with a circle has undergone collision with another net. This classification is merely exemplary and a finer classification may also be employed.

First, a case is shown where a routing segment has its both ends fixed because these ends are terminals (FIG. 4(*a*)). Second is a case where the routing segment has its one end fixed because this end is a terminal, with the other end of the routing segment being an initial routing of the net to which the segment belongs, or a previously finalized routing (FIG. 4(*b*)). Third is a case where both ends of a routing segment are either an initial routing segment or a previously finalized routing segment of a net to which the segment belongs and where the segment cannot be slid (FIG. 4(*c*)). Fourth is a case where both ends of the routing segment represent the initial routing segment or previously finalized routing segment of the net to which the segment belongs, while the segment can be slid (FIG. 4(*d*)).

The sliding herein means moving a routing segment in translational movement without changing the total routing length of a net or without interrupting each connection between the routing segments.

Figure 4A:
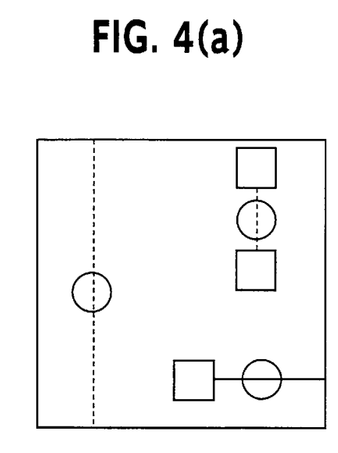
FIG. 4 illustrates a routing pattern used in judgment according to the embodiment of the present invention.
Figure 4B:
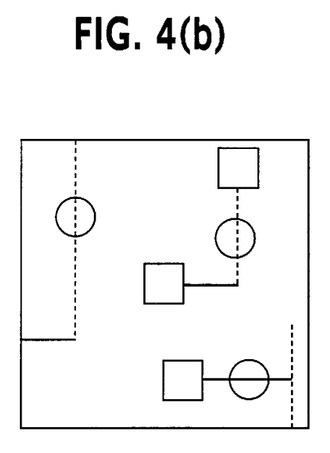
Figure 4C:
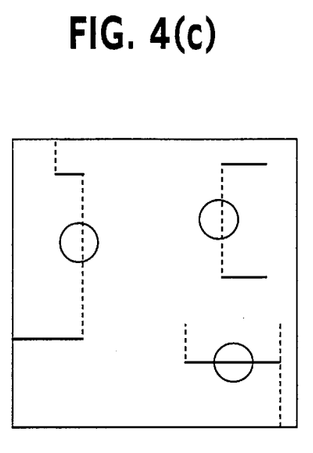
Figure 4D:
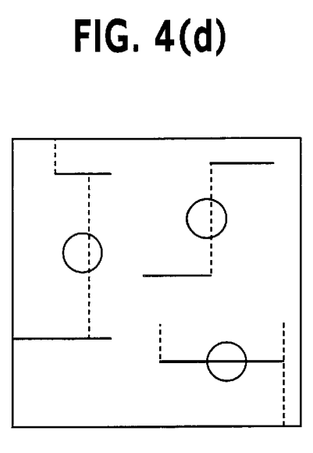
Figure 5:
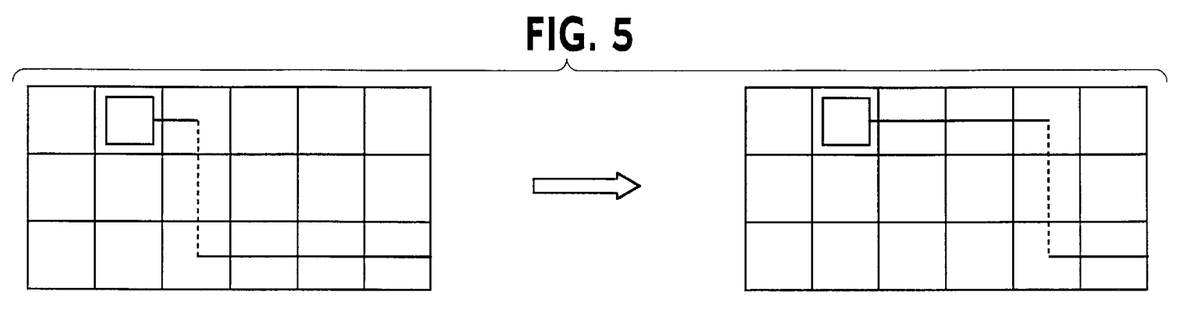
FIG. 5 illustrates a sliding of a routing segment.

This order of priority is the order of higher probability of increase in the number of tracks in use or increase in the routing length upon moving the routing segments for evading the collision. In particular, the first pattern (a) gives rise to increase in the number of bends, in the number of tracks used and in the routing length in order to evade the collision against other net(s), provided that the XY rule is obeyed. Therefore, the routing segment is preferably routed straightly without collision evasion.

Therefore, patterns of the routing segments which have undergone collision are compared to one another and the order is set so that the routing segments belonging to the abovementioned patterns will be finalized earlier. The order of the routing segments belonging to the same pattern is not modified in the present Example.

Figure 6A:
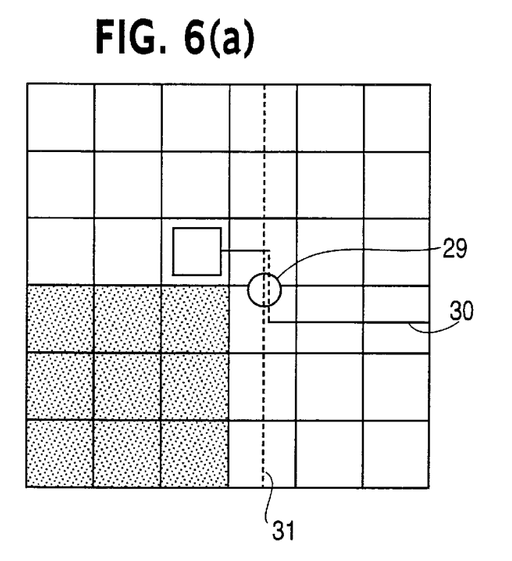
FIG. 6 illustrates a layout of an Example 1.
Figure 6B:
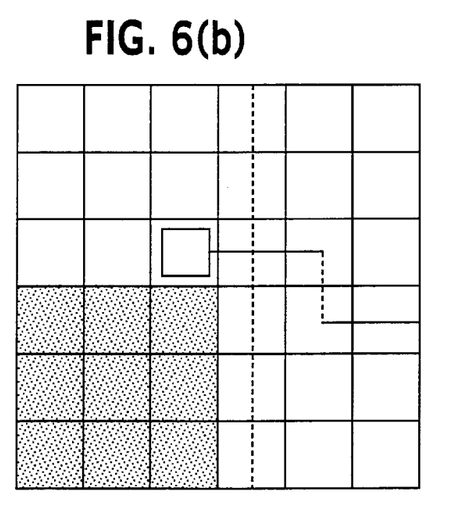

If this judgment criterion is used, the following example can be solved. In a conventional technique, an initial routing of FIG. 6(*a*) makes a detour, as shown in FIG. 14(*b*), because of finalizing the nets in the order of 30 and 31. However, in the present method, the finalizing order is interchanged so that net 31 is routed prior to net 30, since the segment of a collision point 29 of net 30 can be slid (pattern 4), while net 31, made up only of a sole vertical routing, has its both ends formed as pseudo terminals (pattern 1). The result is that the routing can be defined without detour or bends, as shown in FIG. 6(*b*).

Figure 7A:
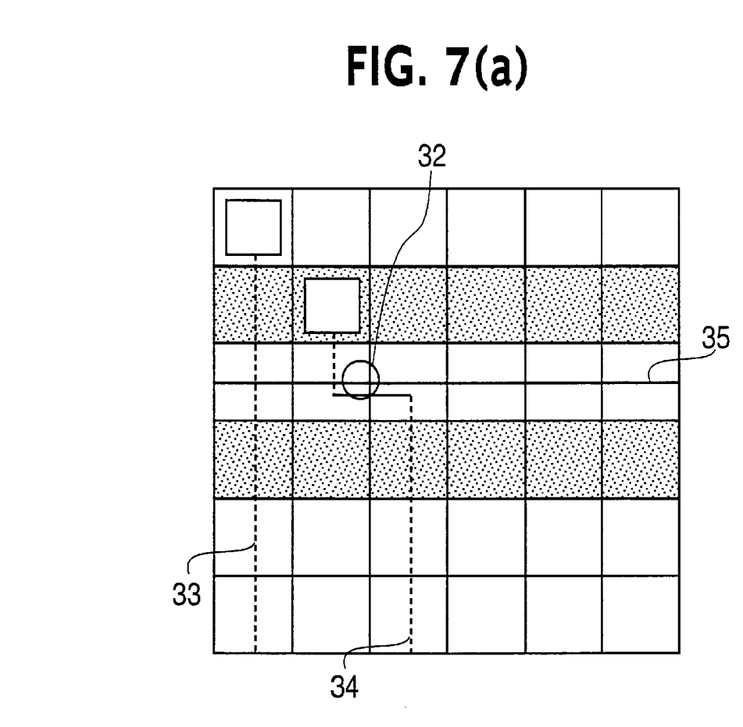
FIG. 7 illustrates another layout of the Example 1.
Figure 7B:
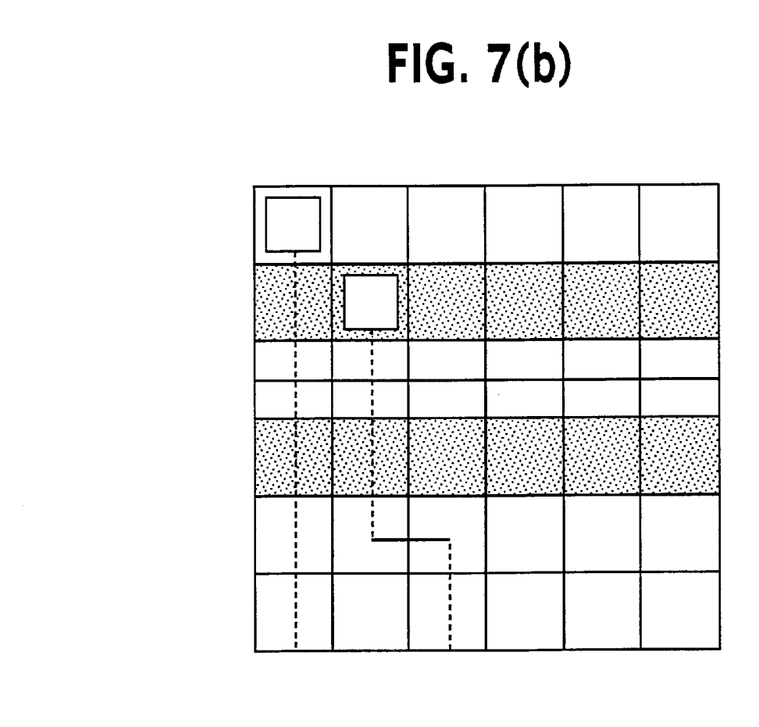

In an example of an initial routing shown in FIG. 7(*a*), uncompleted routing occurs with the conventional method, as shown in FIG. 15(b), because the nets are finalized in the order of 33, 34 and 35. With the present method, the finalizing order is changed to 33, 35, 34, as is the case with the previous example, so that routing can be realized without leaving uncompleted routing, as shown in FIG. 7(b).

In the present-day routing problem with an extensive high integration degree, there has been no allowance in the routing area, and a high routing density is required. In such a routing problem, a detour path gives rise for one or more detour paths to increase the routing length through the detour or bends. If the routing area becomes congested in this manner, there is no routing area left for subsequently fanalized nets to pass through such that uncompleted routing tends to occur.

Figure 8A:
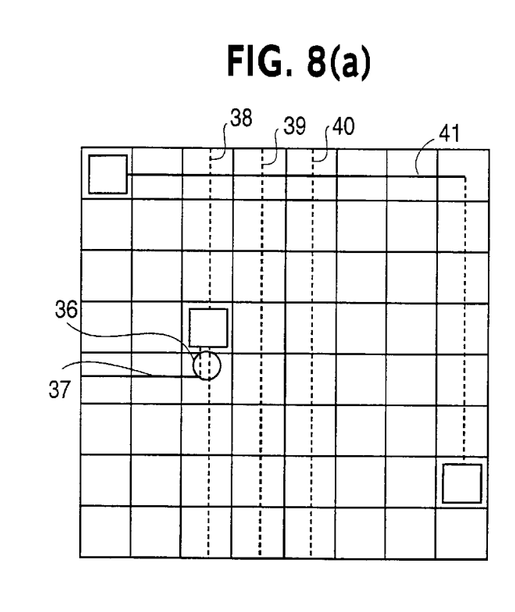
FIG. 8 illustrates yet another layout of the Example 1.
Figure 8B:
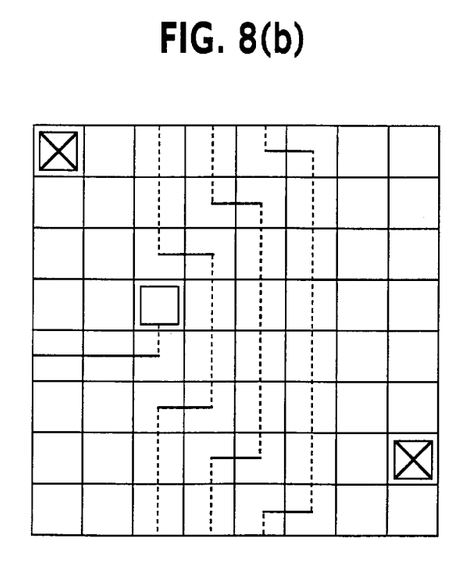
Figure 8C:
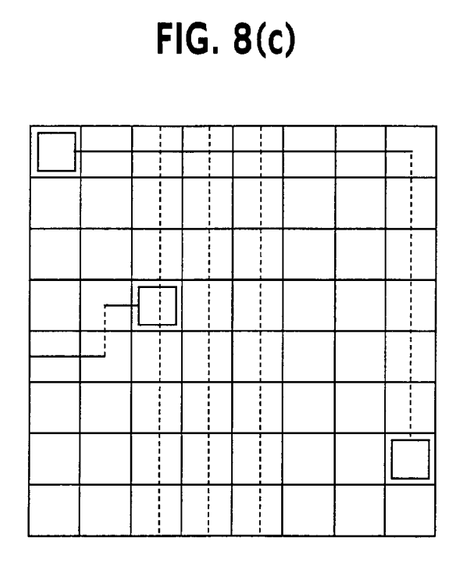

FIG. 8 shows such an example, where (a) and (b) denote an initial path and a path by the conventional method, respectively. Since the nets are herein finalized in the order of 37, 38, 39, 40, 41, there are produced detour paths or bend paths 38, 39 and 40 and resultant uncompleted routing 41. The present method renders it possible to complete the routing of the entire nets without detour or bend, as shown in FIG. 8(c).

Figure 9A:
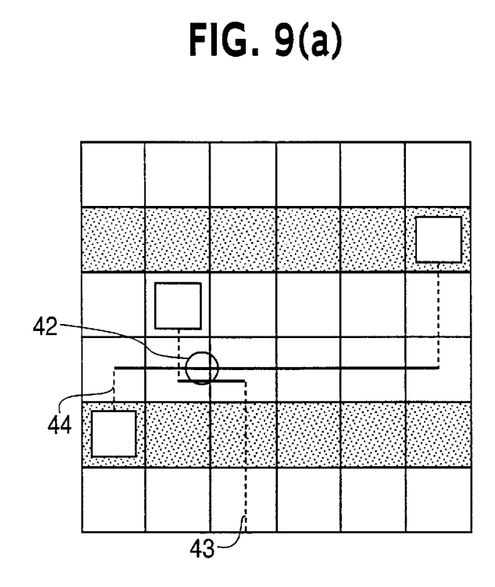
FIG. 9 illustrates a layout of Example 2.

An example in which the order is judged based on the length of the routing segment which has undergone collision (termed Example 2) is now explained. The initial paths of FIG. 9(a) are all shaped so as to permit sliding of a routing segment which has undergone collision, so that the order is not changed in accordance with the criteria of Example 1.

Figure 9B:
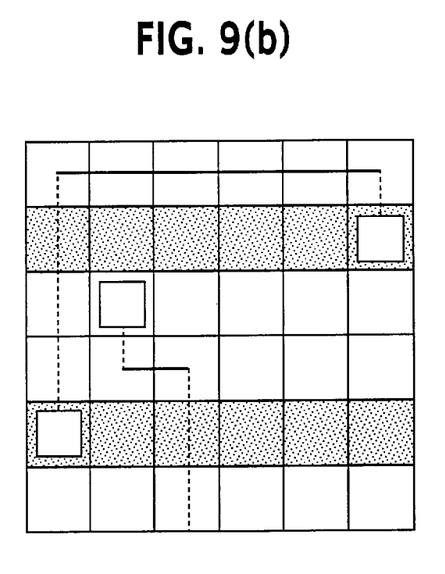

However, in this example, if the routing length is finalized in the order of shortest net 43,44, a detour is produced as shown in FIG. 9(b). This is because, in fact sliding could not be performed because there were terminals of another net or obstruction area etc. at the target place of sliding, even if sliding are attemped. Further, usually, at the time of finalizing the longest path, many short paths have been already finalized, and thus offering more difficulty in sliding a long path without detour or bends.

If such a long routing segment has undergone collision, a probability becomes high that detours and many bends have to be used to avoid the existing collisions. Therefore, the order is set so that the routing segment with a longer length is routed earlier, while the routing segment with a shorter length is routed later. Since the length of the routing segment which has undergone collision of the net 43 is 1, while that of the net 44 is 5, the net 44 is finalized earlier, such that the result of FIG. 9(c) is obtained.

Figure 10A:
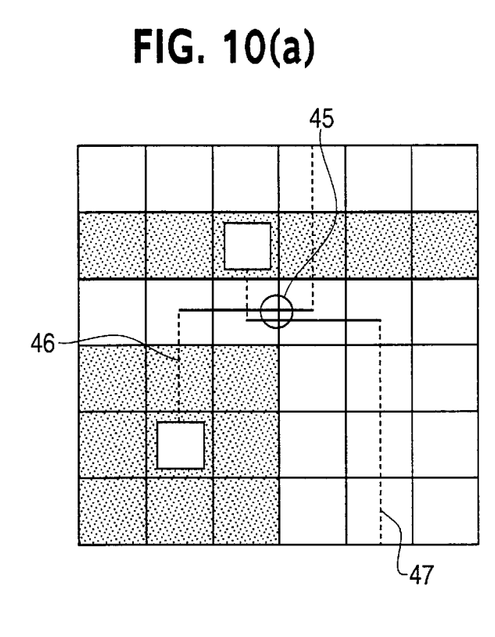
FIG. 10 illustrates a layout of Example 3.
Figure 10B:
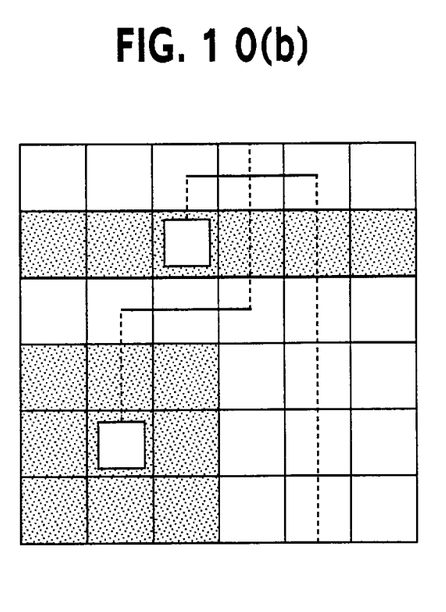
Figure 10C:
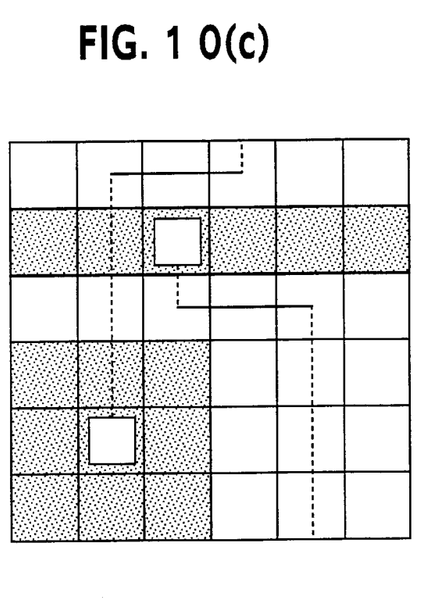

An example in which the order is judged based on the routing length from the terminal to the routing segment which has undergone collision (termed herein Example 3) is explained. Initial paths of FIG. 10(a) are equal in the routing length. However, if the net 46 is finalized first, a detour path results, as shown in FIG. 10(b). In general, the vicinity of a terminal tends to be congested, such that a path can be laid in this area with difficulties, so that routing in this area needs to be completed earlier; otherwise it becomes difficult to evade other nets.

Therefore, the routing length from each end point of a segment which has undergone collision to a pseudo terminal is obtained and a shorter value of a net which has undergone collision is compared to a similarly shorter value of another net which has undergone collision. The net having the routing segment having a shorter length to the terminal is routed first, while the net having the routing segment having a longer length to the terminal is routed later.

Figure 9C:
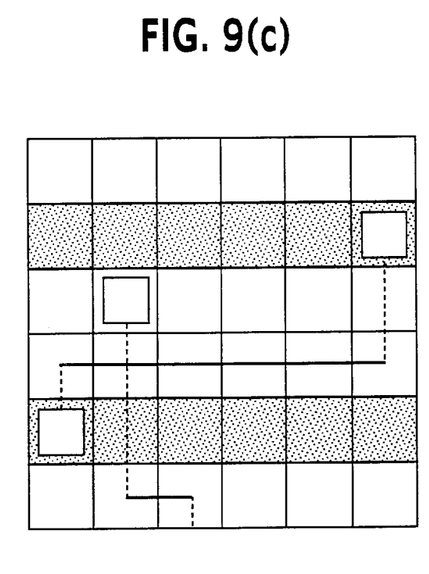

In FIG. 10(a), the routing length from the routing segment which has undergone collision to the terminal is 2 for the net 46, while that for the net 47 is 1, so that the net 47 is finalized first to arrive at the result shown in FIG. 9(c).

An example in which the order is judged in consideration of the width of translational movement of the routing segment which has undergone collision for collision evasion (termed Example 4) is now explained.

Figure 11A:
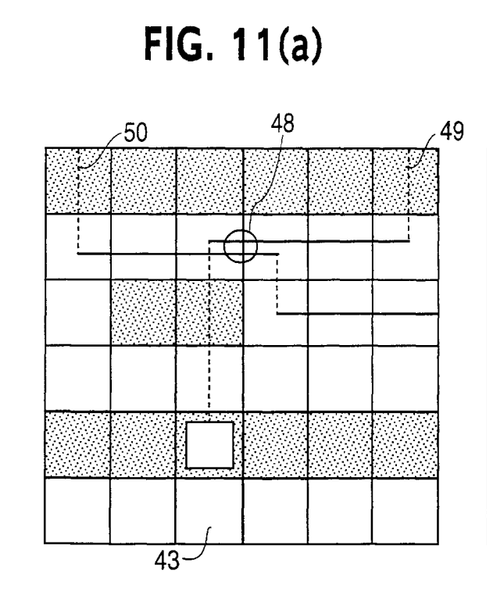
FIG. 11 illustrates a layout of Example 4.
Figure 11B:
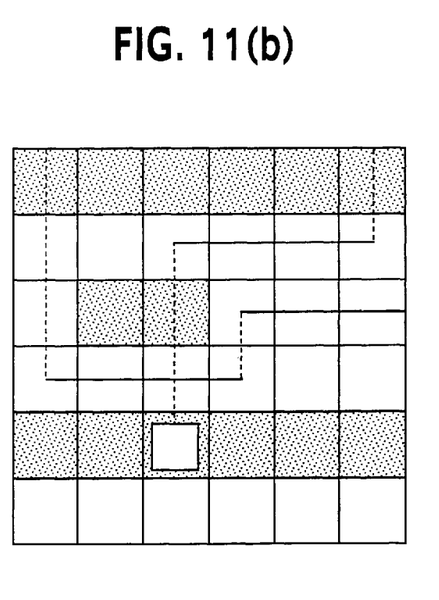

The initial paths of FIG. 11(a) are all shaped for enabling sliding of the routing segment which has undergone collision, so that the order cannot be changed by the reference of Example 1. However, if the order of the nets is 49, 50 in the order of increasing routing length, the result is occurrence of detour routing, as shown in FIG. 11(b).

For reducing the possibility of detour routing or bend routing, it is effective to slide the routing segment for estimating whether or not the collision can really be evaded. One of such methods is to find the sum of the lengths of the paths connected to both ends of the segment desired to be slid (termed as "slide width") and to set the order so that the net having a smaller value of the sum (slide width) is routed first while the net having a larger value of the sum (slide width) is routed later. The reason is that a short slide width indicates a less number of candidates routings for slide movement.

Figure 11C:
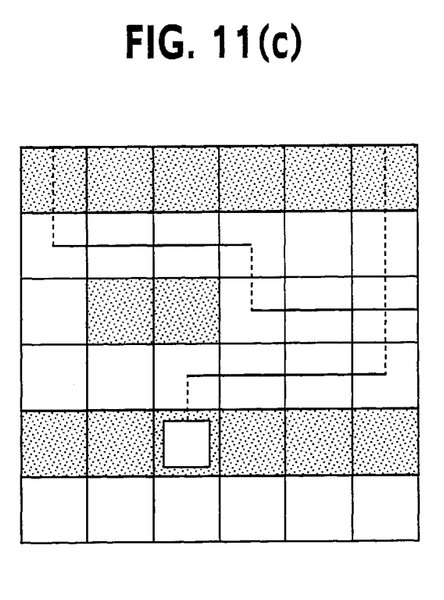

In the present Example, the slide width of the net 49 is 5, while that of the net 50 is 3, so that the net 50 with a smaller slide width is finalized first to arrive at the result of FIG. 11(c).

The previous Examples, excluding Example 4, have been dealt with independently. In actual problems, it is effective to combine the judgment criteria together. For example, it is judged whether or not an order can be set in accordance with the criterion of Example 1. If the order cannot be set in this manner, the value shown by the following equation 1, that is the value obtained on multiplying the values of the routing lengths $L_2$, $L_3$ and $L_4$ of the Examples 2, 3 and 4 with weights $W_2$, $W_3$ and $W_4$, respectively, and summing the products together, is found from net to net and the order is set so that the net having a smaller value of the results of comparison will be finalized first. It is noted that $L_4$ is 0 if none of the segments which have undergone collision can be slid.

[Equation 1]

$$C = L_2 \times W_2 + L_3 \times W_3 + L_4 \times W_4 \qquad \text{[Equation 1]}$$

For evaluating the length, such a method may be envisaged in which penalty is accorded if the length is not less or not more than a preset value.

Although the foregoing description is based on two layers, the present invention can be applied to a problem having three or more layers. On the other hand, although the description has been made of a path according to the so-called XY rule employing the first layer for routing in the horizontal direction and the second layer for routing in the vertical direction, the present invention can be applied to a path not conforming to the XY rule.

It should be noted that modifications may be done without departing from the gist and scope of the present invention as described and claimed as appended.

What is claimed is:

1. An automatic routing method for designing a layout for an LSI and a printed board comprising:

entering data corresponding to layout design information with a data input device;

storing said layout design information in a memory device;

provisionally routing all nets with reference to said layout design information;

setting an order for finalized routing of the nets so that, in case of an occurrence of a net overlapping in said provisional routing, those nets that allow for more facilitated evasion of net overlapping will be finalized later; and performing finalized routing of all nets in accordance with the set order.

2. The automatic routing method as defined in claim 1 wherein said layout design information is comprised of design rule information, net list information, terminal information, obstruction information, pre-route information and the provisional routing information, and wherein said memory device includes a design rule information memory unit for storing the design rule information, a net list information memory unit for storing the net list information, a terminal information memory unit for storing the terminal information, an obstruction information memory unit for storing the obstruction information, a pre-route information memory unit for storing the pre-route information and a provisional routing information memory unit for storing the provisional routing information.

3. The automatic routing method as defined in claim 1 wherein all nets are provisionally routed with reference made to the design rule information, net list information, terminal information, obstruction information and the pre-route information, the automatic routing method further comprising:

initially ordering the routing of the nets to begin from a net of a shortest routing length, if there is no net collision;

comparing colliding nets if a collision point is found; and changing the order of the routing of the nets such that a first colliding net is routed later than a second colliding net if the first colliding net is judged to allow for more facilitated evasion of a collision than the second colliding net and is set to be routed earlier than the colliding net.

4. The automatic routing method as defined in claim 1 wherein, if new initial routing is done in a multi-terminal net, this net is inserted into a suitable position in a queue by setting an order in the queue for finalized routing, and wherein, in case of collision with previously finalized routing, a provisional path between two nearest terminal is found without allowing for collision with previously finalized routing thereby to enter the net in the queue.

5. The automatic routing method as defined in claim 1 wherein the shape of both ends of a routing segment of a net subjected to overlapping is used as a criterion for judgment of evading net overlapping.

6. The automatic routing method as defined in claim 1 wherein the length of a routing segment of a net subjected to overlapping is used as a criterion for judgment of evading net overlapping.

7. The automatic routing method as defined in claim 1 wherein the routing length from a terminal to a routing segment of a net subjected to overlapping is used as a criterion for judgment of evading net overlapping.

8. The automatic routing method as defined in claim 1 wherein the width of translational movement of a routing segment of a net subjected to overlapping is used as a criterion for judgment of evading net overlapping.

9. The automatic routing method as defined in claim 1 wherein any combination of factors selected from the group consisting of the shape of both ends of a routing segment of a net subjected to overlapping, the length of the routing segment of a net subjected to overlapping, the routing length from a terminal to the routing segment of a net subjected to overlapping and the width of translational movement of the routing segment of a net subjected to overlapping is used as a criterion for judgment of evading net overlapping.

10. The automatic routing method as defined in claim 9 wherein at least one of the length of a routing segment, the routing length from a terminal to a routing segment and the width of translational movement of the routing segment, each subject to overlapping, is estimated based on values magnified with a given weight and is used as the criterion for judgment of evading net overlapping.

11. The automatic routing method as defined in claim 10 wherein the sum of said values magnified with a given weight are used as the criterion for judgment.

* * * * *